(12) United States Patent
Yue et al.

(10) Patent No.: US 8,980,651 B2
(45) Date of Patent: Mar. 17, 2015

(54) OVERLAY MEASUREMENT FOR A DOUBLE PATTERNING

(75) Inventors: Hongyu Henry Yue, Plano, TX (US); Shifang Li, Pleasanton, CA (US)

(73) Assignee: Tokyo Electron Limited, Tokyo (JP)

( * ) Notice: Subject to any disclaimer, the term of this patent is extended or adjusted under 35 U.S.C. 154(b) by 594 days.

(21) Appl. No.: 13/250,615

(22) Filed: Sep. 30, 2011

(65) Prior Publication Data

US 2013/0084655 A1    Apr. 4, 2013

(51) Int. Cl.
*H01L 21/00* (2006.01)
*G03F 7/20* (2006.01)

(52) U.S. Cl.
CPC ........ *G03F 7/70633* (2013.01); *G03F 7/70466* (2013.01)
USPC ................................. 438/7; 438/16; 430/324

(58) Field of Classification Search
USPC .......................................................... 438/14
See application file for complete search history.

(56) References Cited

U.S. PATENT DOCUMENTS

| | | | |
|---|---|---|---|
| 6,943,900 | B2 | 9/2005 | Niu et al. |
| 7,467,064 | B2 | 12/2008 | Vuong et al. |
| 8,764,999 | B2 * | 7/2014 | Dunn et al. ...................... 216/41 |
| 2009/0311634 | A1 * | 12/2009 | Yue et al. ...................... 430/323 |
| 2011/0244403 | A1 | 10/2011 | Carcasi et al. |

OTHER PUBLICATIONS

Dunn, et al., "Sidewall Image Transfer Pitch Doubling and Inline Critical Dimension Slimming," U.S. Appl. No. 13/158,899 (2011), 35 pp.
Dunn, et al., "Double Patterning With Inline Critical Dimension Slimming," U.S. Appl. No. 13/158,868 (2011), 31 pp.
Luong, et al., "Method for Patterning a Full Metal Gate Structure," U.S. Appl. No. 13/053,216 (2011), 42 pp.
Rani S. Ghaida and Puneet Gupta, "Within-Layer Overlay Impact for Design in Metal Double Patterning", IEEE Trans Semicond Manuf, vol. 23, No. 3, Aug. 2010, p. 381-390.

* cited by examiner

*Primary Examiner* — Jack Chen
(74) *Attorney, Agent, or Firm* — Wood, Herron & Evans, LLP

(57) ABSTRACT

A multi-patterning method of manufacturing a patterned wafer provides test structures designed to enhance overlay error measurement sensitivity for monitoring and process control. One or more patterns are overlaid on a first pattern, each of a given pitch, with the elements interleaved. Test structure is formed with elements of the overlaid patterns spaced away from respective mid-positions more closely toward elements of the first pattern. In some embodiments, test structure elements of the second pattern are overlaid midway between mid-positions of elements of the first pattern and measured by scatterometry. In other embodiments, test structure elements of the second pattern are overlaid at a slightly different pitch than the elements of the first pattern and measured by reflectivity. Measurements are compared with library measurements to identify the error, which may be fed back to control the patterning process. The multi-patterning may be formed by LELE, LLE, LFLE, or other methods.

18 Claims, 8 Drawing Sheets

OVERLAY MEASUREMENT FOR A DOUBLE PATTERNING

FIELD OF THE INVENTION

This invention relates to the identifying of overlay error in multiple patterns applied by any one of various double patterning techniques, and particularly, to the measurement of overlay error, and more particularly, to the providing of reference patterns on unused areas of the wafers to improve the sensitivity of such measurements.

BACKGROUND OF THE INVENTION

In material processing methodologies, pattern etching involves the application of a thin layer of light-sensitive material, such as photo-resist, to an upper surface of a substrate that is subsequently patterned in order to provide a mask for transferring this pattern to the underlying thin film on a substrate during etching. The patterning of the light-sensitive material generally involves exposure of the light-sensitive material to patterned electromagnetic (EM) radiation using, for example, a photo-lithography system, followed by the removal of the irradiated regions of the light-sensitive material (as in the case of positive photo-resist), or non-irradiated regions (as in the case in negative resist) using a developing solution. Moreover, this mask layer may include multiple sub-layers.

But in attempting to meet the increasing demand to produce smaller features, photo-lithography reaches a limit in resolution, currently at a pitch size of roughly 80 nanometers (nm). So more recently, the use of double patterning and related technologies have become more prevalent to double or otherwise multiply the density or spatial frequency of the pattern. In such frequency multiplying techniques, patterns are applied in two or more lithographic sequences or exposures at a given pitch and interleaved to produce a finer resolution of, for example ½, the given pitch. A resolution of, for example, 60 nm can be produced by interleaving two patterns with a first pattern of 120 nm pitch P overlayed with second pattern, spaced at P/2 from the first. Similarly, such a pattern can be produced by interleaving three patterns of 180 nm pitch spaced from each other at P/3. For convenience, the term "double patterning" is used for a technique involving two or more patterns so interleaved.

Two basic techniques for multiplying the spatial frequency of a pattern have been used, namely: (1) Sidewall spacer process (or sidewall image transfer); and (2) "Double Exposure", and "Double Patterning", such as LLE (Litho-Litho-Etch) or LELE (Litho-Etch-Litho-Etch).

In the spacer process, the spacer is used as the final mask to create the final pattern in the thin film. The spacer is generated in a multi-layer mask. The mask layer typically comprises a light-sensitive material, such as a photo-resist layer, that is patterned using conventional photo-lithography techniques. The multi-layer mask may also include a bottom anti-reflective coating (BARC) and/or a hard mask. The pattern in the light-sensitive layer is transferred to the BARC and/or hard mask layers using etching techniques. However, current techniques for removing the light-sensitive layer may damage the BARC, leading to poor profile control and residual film left over before the spacer deposition. In addition, if the BARC does not have the mechanical properties necessary to tolerate the stresses induced during the spacer formation process, then again, poor profile control may result. U.S. Patent Application Publication No. 2009/0311634 A1 entitled "METHOD OF DOUBLE PATTERNING USING SACRIFICIAL STRUCTURE" discusses the problems with the spacer method as well as improved methods of patterning by forming a sacrificial structure over the thin film. U.S. patent application Ser. No. 13/158,899 filed Jun. 13, 2011, and entitled "SIDEWALL IMAGE TRANSFER PITCH DOUBLING AND INLINE CRITICAL DIMENSION SLIMMING", addresses sidewall image transfer with or without LFLE, also with insertion of a slimming step.

With the Double Patterning techniques, the interleaving of patterns in two or more subsequent exposures is involved. LLE and LELE techniques are examples. With LELE techniques, the substrate cycles between lithographic steps and etching steps (e.g., (a) coat substrate with first resist, (b) image the first resist with first pattern, (c) develop first pattern in the first resist, (d) etch the developed first pattern in the resist into an underlying layer, (e) repeat (a)-(d) for second resist and second pattern). With LLE techniques, all photoresist coating steps and image exposure steps are performed prior to etching (e.g., (a) coat substrate with resist, (b) image the resist with first pattern, (c) image the resist with second pattern, (d) develop the first and second patterns in the resist, and then (e) etch the developed first and second patterns in the resist to underlying layers). L(F)LE (Litho-Freeze-Litho-Etch) is a form of LLE wherein all of the photoresist coating steps and image exposure steps are performed prior to exiting a track system (photoresist spin-coating system) and entering an etching system. The freezing step can involve baking to change the chemical properties of the first pattern material, irradiating the first pattern material with EM radiation to change the chemical properties of the first material pattern, reacting the surface of the first pattern material with a cross-linking material, depositing a protective layer over the first pattern material, or some other method to protect the first pattern during exposure and development of the second pattern. The LLE and L(F)LE processes have the advantage of performing all of the lithographic sequences or exposures prior to removal or transfer of substrates for etching.

With the above described methods, when various layers on a semiconductor substrate are being patterned with multiple patterns during the sequence of steps that leads to the fabrication of a device or structure on the substrate, it is important to accurately and precisely align one pattern relative to another. Identifying and correcting overlay error for multiple patterns is a challenge, particularly as feature sizes become smaller and smaller. Overlay error and its effects are described in a paper by R. S. Ghaida and P. Gupta. Design-Overlay Interactions in Metal Double Patterning. *Proc. SPIE* 7275, 2009. Overlay error must be detected and measured so that processes can be adjusted to reduce the error to within tolerable limits.

Methods for measuring overlay error include image-based methods and diffraction-based methods applied to test structures printed in a test area arranged within an unused portion of the substrate, such as a scribe line. In the image-based methods, overlay marks may include marks of the box-in-box type to assess the placement of multiple patterns and measure the overlay error. Therein, the implementation of the box-in-box type overlay mark involves printing images with each lithographic step, such as rectangular images of different sizes, for example one inside the other, and then optically measuring their relative positions to produce measurements that identify alignment errors. The image base method has resolution limited by the optical system, that include optics aberration and limited image sensor resolutions. A typical measurement uncertainty is about a couple of nm, that is too larger for contemporary and future nodes.

In the diffraction-based methods, optical scatterometry-based metrology may be applied to a test structure printed in the unused area of the substrate by each of the lithographic steps, wherein light scattered from the printed test structure may be detected and measured. The measurements of scattered light are compared with a library of data to extract the geometry of the measured test structure for comparison with stored measurements of scattered light from reference test structures to determine the existence of various errors. A problem with this method has been the difficulty in obtaining sufficient resolution and sensitivity to identify or distinguish the error being measured.

U.S. Pat. No. 7,467,064, entitled "TRANSFORMING METROLOGY DATA FROM A SEMICONDUCTOR TREATMENT SYSTEM USING MULTIVARIATE ANALYSIS," describes an integrated metrology tool that utilizes scatterometry for inspecting feature geometry in semiconductor manufacturing. The metrology is increasingly utilized to ensure that individual process steps, as well as a sequence of process steps, adhere to design specifications. In optical scatterometry, periodic gratings are embedded in semiconductor substrates in close proximity to the locations for the formation of operating structures in semiconductor devices. By determining the profile of the periodic grating, the quality of the fabrication process utilized to form the periodic grating, and by extension the operating structure of the semiconductor device proximate the periodic grating, can be evaluated.

In general, optical scatterometry involves illuminating the periodic grating with electromagnetic (EM) radiation, and measuring the resulting diffracted signal. The characteristics of the measured diffraction signal is typically compared to a library of pre-determined diffraction signals (i.e., hypothetical diffraction signals) that are associated with known profiles. When the best match is made between the measured diffraction signal and one of the hypothetical diffraction signals, then the profile associated with the matching hypothetical diffraction signal is presumed to represent the profile of the periodic grating. The process of generating a hypothetical diffraction signal involves performing a large number of complex calculations, which can be time consuming and computationally intensive. Differences in measured signals can often consist merely of a slight shift or small change in the shape of broad spectral features in the measured diffraction signals.

There remains a need to improve the resolution and sensitivity of measurements of overlay error in multiple patterning on semiconductor wafers.

SUMMARY OF THE INVENTION

An objective of the present invention is to measure and control the overlay error between the two or more patterns applied to a substrate such as a semiconductor wafer in different steps. A particular objective of the invention is to improve the sensitivity of overlay error measurement by optical methods, and more particularly in such as methods using optical scatterometry measurement of overlay error or other optical reflectivity measurement methods.

According to principles of the present invention, special test structures for optical overlay error measurement, to be formed in the unused areas of a substrate, are provided. In particular embodiments, the special test structure is formed by shifting the second pattern relative to the first pattern to improve the sensitivity of optical measurements of the alignment error between the two patterns.

According to first embodiments of the present invention, a first pattern is exposed on a semiconductor wafer with lines or other features spaced at a given pitch, and a second pattern is exposed on the wafer with lines or other features spaced from each other at the same given pitch, and placed midway between those of the first pattern, such that the features of the first and second patterns are spaced from each other by ½ pitch. At the same time and with the same exposures, a special test structure is formed in an unused area of the wafer with the features of the second pattern shifted toward features of the first pattern. In particular embodiments, the shift is by ¼ pitch. Similarly, with triple patterning, the patterns would be spaced from each other by ⅓ pitch and similarly shifted, for example, by ¼ pitch for the second pattern and ¾ pitch for the third pattern. With such embodiments, error may be measured by scatterometry techniques.

In other embodiments of the present invention, a first pattern is exposed on a semiconductor wafer with lines or other features spaced at a given pitch, and a second pattern is exposed on the wafer with lines or other features spaced from each other at the same given pitch, and placed midway between those of the first pattern, such that the features of the first and second patterns are spaced from each other by ½ pitch. At the same time and with the same exposures, a special test structure is formed in an unused area of the wafer with the first pattern spaced at the given pitch and the second pattern spaced at a slightly different pitch than the given pitch of the first pattern. For example, the difference in pitch may be 1/1000 P. The difference in pitch is such that the location of the patterns will change by ½ pitch over a dimension of tens of microns on the wafer, for example, about 40 microns. As such the patterns will shift in and out of phase in twice this distance. The concept can be analogy to a beat frequency in acoustics ($\omega$). When two sinusoidal signals are superimposed, one of frequency w and the other of frequency $\omega+\Delta\omega$ (wherein $\Delta\omega \ll \omega$), a signal of approximately frequency w (e.g., $(2\omega+\Delta\omega/2)$ is achieved having an amplitude modulated at $\Delta\omega$. The difference here is we are working in space rather than time, and therefore in wavenumber space rather than frequency space, as with an interference pattern in optics. By "beating" one pattern relative to another pattern, overlay error is being measured through changes in the wave packet. The measurement is being amplified at about $p/\Delta p$, wherein p is the pitch and $\Delta p$ is the change in pitch. Because of this increase in sensitivity with these embodiments, complex scatterometry techniques of measurement are not needed. Rather, the relative intensity of reflected light can be measured as a function of position on the test structure. In a further extension, the relative polarization of reflected light can be measured as a function of position on the test structure. Or the combination of relative intensity and polarization.

With the embodiments of the invention, optical measurements are taken of the structure with different known errors and the diffraction pattern data is stored in a library. Measurements then made of unknown errors on wafers are compared with the library to identify the best match to thereby identify the type or magnitude of the error present on the wafer.

The invention may be used in evaluating product wafers or in identifying error during production, between wafers, to make process adjustments to reduce or eliminate the errors. Feedback control can be utilized based on the overlay error measurement according to various known models to translate the measurement results into input parameters for a lithography or exposure tool to reduce or eliminate the error for subsequent wafers.

These and other objects and advantages of the present invention will be more readily apparent from the following detained description, in which:

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION OF SEVERAL EMBODIMENTS

A method of measuring overlay alignment error in double patterning with enhanced sensitivity is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "certain embodiments", "one embodiment" or "an embodiment" or variation thereof means that a particular feature, structure, material, or characteristic described in connection with the embodiment is included in at least one embodiment of the invention, but do not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Nonetheless, it should be appreciated that, contained within the description are features which, notwithstanding the inventive nature of the general concepts being explained, are also of an inventive nature.

"Substrate" as used herein generically refers to the object being processed in accordance with embodiments of the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

Figure 1A:
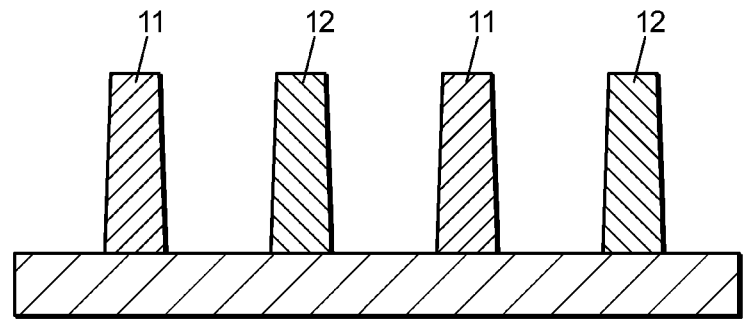
FIGS. 1A, 1B and 1C are cross-sectional diagrams of examples of the patterned photo-resist layer on a section of a semiconductor wafer applied by various Double Patterning processes as known in the art.
Figure 1B:
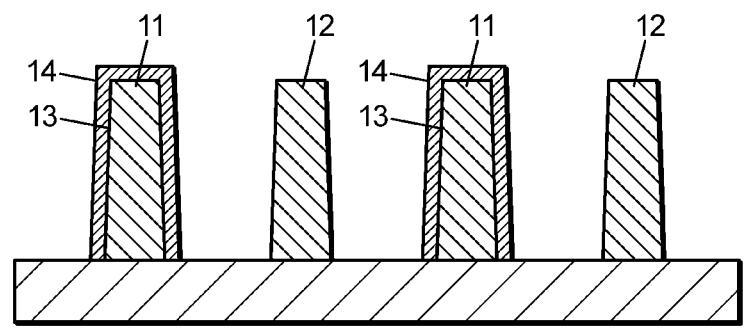
Figure 1C:
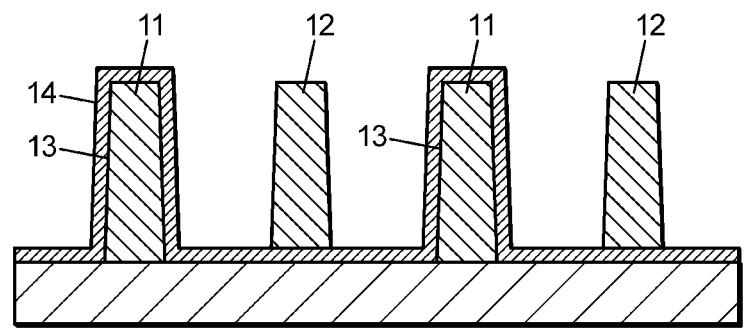

In the drawings, where like reference numerals designate identical or corresponding parts throughout the several views, FIG. 1A diagrammatically illustrates the final structure deposited in an unused area of a semiconductor wafer for measurement. The structure in the diagrammatic illustration includes two lines or other elements 11 of a first pattern spaced apart a given pitch P. The figure also includes two similar elements 12 of a second pattern, also spaced apart the given pitch P. The elements 12 of the second pattern are shifted or offset by ½ pitch, P/2, from the elements 11 of the first pattern. FIG. 1B illustrates a similar set of two pairs of elements 11 and 12 of respective first and second patterns in which the first applied pattern was "frozen" by protecting the surfaces 13 of the elements 11 of the first pattern by chemically reacting the surfaces 13, heat treating the surface 13, or using some other freezing technique. FIG. 1C is a further illustration showing the elements 11 of the first applied pattern covered with a coating layer 14 before application of the elements 12 of the second pattern.

One method of creating the structure illustrated in FIGS. 1A-1C is described in U.S. patent application Ser. No. 13/158,868 on Jun. 13, 2011, entitled "DOUBLE PATTERNING WITH INLINE CRITICAL DIMENSION SLIMMING", expressly incorporated by reference herein, which addresses LFLE with the insertion of a slimming step. Referring to FIGS. 2A through 2G, such a method for double patterning a substrate begins with forming a first layer of radiation-sensitive material 120 on a substrate 110. The first layer of radiation-sensitive material 120 may include a photo-resist, for example, a 248 nm (nanometer) resist, a 193 nm resist, a 157 nm resist, an EUV (extreme ultraviolet) resist, an electron beam sensitive resist, a thermal freeze photo-resist, an electromagnetic (EM) radiation freeze photo-resist, or a chemical freeze photo-resist.

The first layer of radiation-sensitive material 120 may be formed by spin-coating the material onto substrate 110 and may be formed using a track system, such as, for example, a Clean Track ACT 8, ACT 12, LITHIUS, LITHIUS Pro, or LITHIUS Pro V resist coating and developing system commercially available from Tokyo Electron Limited (TEL). Other systems and methods for forming a photo-resist film on a substrate are well known to those skilled in the art of spin-on resist technology. The coating process may be followed by one or more first post-application bakes (PAB) to heat the substrate 110 and one or more cooling cycles, following the one or more first PABs, to cool the substrate 110.

Figure 2A:
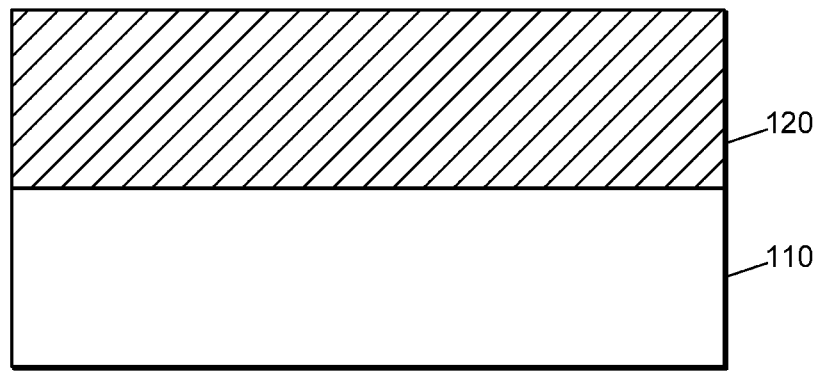
FIGS. 2A through 2G are simplified schematic representations of a method of double patterning a substrate as known in the art.
Figure 2B:
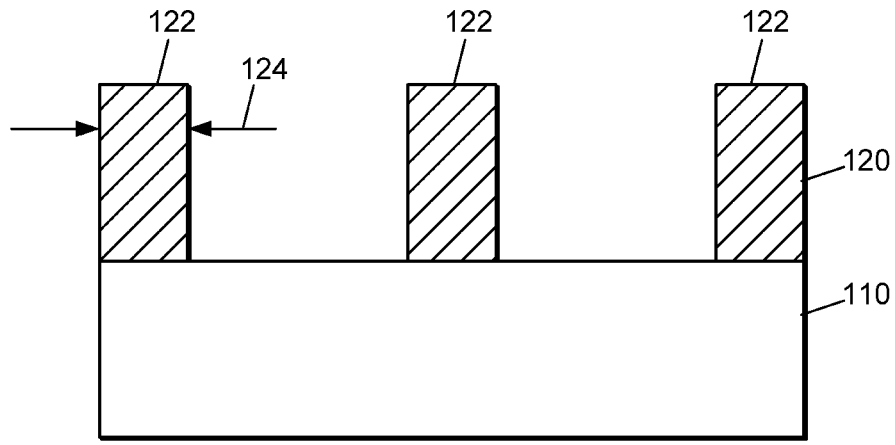

As shown in FIG. 2B, the substrate 110 having the first layer of radiation-sensitive material 120 is aligned at a first alignment position in a radiation exposure system and imaged with first radiation having a first image pattern. The radiation exposure system may include a dry or wet photo-lithography system. The first image pattern may be formed using any suitable conventional stepping lithography system, or scanning lithography system. For example, the photo-lithography system may be commercially available from ASML Netherlands B.V. (Veldhoven, The Netherlands), or Canon USA, Inc., Semiconductor Equipment Division (San Jose, Calif. 95134), or alternatively, using an electron beam lithography system.

The first layer of radiation-sensitive material 120, having been exposed to the first image pattern, is subjected to a developing process in order to remove the first image pattern region, and form a first pattern 122 in the first layer of radiation-sensitive material 120. The first pattern 122 may be characterized by a first critical dimension (CD) 124, and may include a first line pattern. The developing process can include exposing the substrate to a developing solution in a developing system, such as a track system. For example, the track system can comprise a Clean Track ACT 8, ACT 12, LITHIUS, LITHIUS Pro, or LITHIUS Pro V resist coating and developing system commercially available from Tokyo Electron Limited (TEL). The developing process may be preceded by one or more first post-exposure bakes (PEB) to heat the substrate 110 and one or more cooling cycles, following the one or more first PEBs, to cool the substrate 110.

Figure 2C:
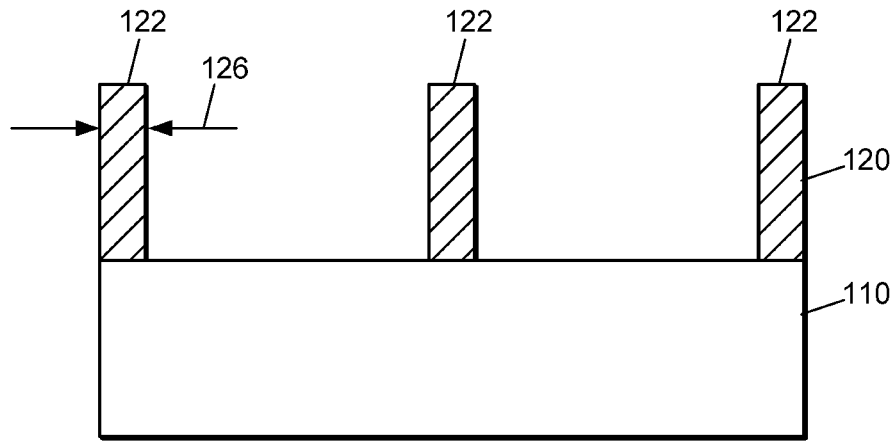
Figure 2D:
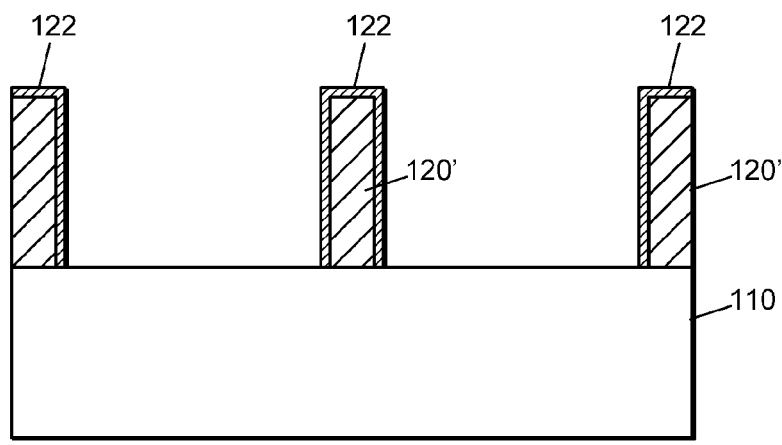

As shown in FIG. 2C, a first critical dimension (CD) slimming process is performed to reduce the first CD 124 to a first reduced CD 126. As shown in FIG. 2D, the first pattern 122 with the first reduced CD 126 in the first layer of radiation-sensitive material 120 is frozen using a freeze process to form a frozen first layer of radiation-sensitive material 120'. In one embodiment, the first layer of radiation-sensitive material 120 may include a thermally curable freeze resist, wherein freezing the first pattern 122 in the first layer of radiation-sensitive material 120 using the freeze process comprises baking (or thermally heating) the first layer of radiation sensitive material 120 to thermally cure and preserve the first pattern 122 with the first reduced CD 126. During the freeze process, the temperature and the bake time are process parameters that may be adjusted to achieve pattern CD control. The terms "freeze", "freezing", "frozen", etc., as used herein, represent a process or a result of the process wherein a layer of radiation-sensitive material is prepared and/or treated to alter a condition of the layer of radiation-sensitive material to withstand subsequent lithographic processing. For example, once a pattern is frozen in the layer of radiation-sensitive material, the pattern substantially remains with or without some change to the pattern CD following an additional lithographic process.

In an alternate embodiment, the first layer of radiation-sensitive material 120 may include an electromagnetic (EM) radiation curable freeze resist, wherein freezing the first pattern 122 in the first layer of radiation-sensitive material 120 using the freeze process comprises exposing the first layer of radiation sensitive material 120 to EM radiation to radiatively cure and preserve the first pattern 122 with the first reduced CD 126. During the freeze process, the EM intensity and the time for exposure are process parameters that may be adjusted to achieve pattern CD control. The first layer of radiation-sensitive material 120 may alternatively include a chemically curable freeze resist, wherein freezing the first pattern 122 in the first layer of radiation-sensitive material 120 using the freeze process comprises applying a chemical freeze material to and reacting the chemical freeze material with the first layer of radiation sensitive material 120 to chemically cure and preserve the first pattern 122 with the first reduced CD 126. During the freeze process, the concentration and type of the chemical freeze material, and the time for exposure are process parameters that may be adjusted to achieve pattern CD control.

Therein, a chemical freeze material may be applied over the first layer of radiation-sensitive material 120 to chemically interact with the first layer of radiation-sensitive material 120. The chemical freeze material may be formed by spin-coating the material onto substrate 110. The chemical freeze material may be formed using a track system. For example, the track system can comprise a Clean Track ACT 8, ACT 12, LITHIUS, LITHIUS Pro, or LITHIUS Pro V resist coating and developing system commercially available from Tokyo Electron Limited (TEL). Other systems and methods for forming a photo-resist film on a substrate are well known to those skilled in the art of spin-on resist technology. The coating process may be followed by one or more bake processes to heat substrate 110 and cure at least a portion of the chemical freeze material.

As a result of applying the chemical freeze material to substrate 110 and heating substrate 110, a portion of the chemical freeze material reacts with the exposed surface of the first layer of radiation-sensitive material 120 to form the frozen first layer of radiation-sensitive material 120'. Thereafter, the chemical freeze material is stripped from the substrate 110 using a strip solution to preserve the first pattern 122 in the frozen first layer of radiation-sensitive material 120'. The strip solution may contain a conventional strip solution or a high normality strip solution. For example, the strip solution contains an active solute having a normality (N) greater than 0.26. Alternatively, the strip solution contains an active solute having a normality (N) greater than 0.3. Alternatively, the strip solution contains an active solute having a normality (N) greater than 0.4. Alternatively, the strip solution contains an active solute having a normality (N) greater than 0.5.

The strip solution may comprise an aqueous alkali solution. Additionally, the strip solution may contain a hydroxide. Additionally, the strip solution may contain a quaternary ammonium hydroxide. Furthermore, the strip solution may include tetramethyl ammonium hydroxide (TMAH). The normality (N) of TMAH in the strip solution may be equal to or greater than 0.26. Alternatively, the normality (N) of TMAH in the strip solution may be greater than or equal to 0.3. Alternatively, the normality (N) of TMAH in the strip solution may be greater than or equal to 0.4. Alternatively, the normality (N) of TMAH in the strip solution may be greater than or equal to 0.5. Alternatively yet, the normality (N) of TMAH in the strip solution may be about 0.32. The concentration of TMAH in the strip solution may be equal to or greater than 2.36% w/v (or 2.36 grams of solute per 100 milliliters (ml) of solution). Alternatively, the concentration of TMAH in the strip solution may be greater than 2.72% w/v (or 2.72 grams of solute per 100 milliliters (ml) of solution). Conventional strip solutions have a normality (N) of 0.26 or less. For example, TMAH-based strip solutions are readily available from a commercial vendor with a normality of 0.26. The increase of the normality (N) in excess of 0.26 leads to an increase in substrate throughput for the double patterning process and a decrease in substrate defectivity which affects device yield.

In each alternative, the freeze process creates a protective layer, extending partly or wholly through the first pattern 122, that protects the first pattern 122 in the first layer of radiation-sensitive material 120 from subsequent lithographic processes, such as coating, exposing, developing, and slimming processes, hence, "freezing" the first layer of radiation-sensitive material 120 to form the frozen first layer of radiation-sensitive material 120' characterized by the first reduced CD.

The first layer of radiation-sensitive material, whether it be a thermally curable freeze resist, an EM curable freeze resist, or a chemically curable freeze resist, may include a material that exhibits cross-linking when thermally treated, radiatively treated, or chemically treated. Additionally, the chemical freeze material may include any removable material that may cause cross-linking in a layer of radiation-sensitive material. The chemical freeze material may include a polymeric material. For example, these materials may include materials commercially available from JSR Micro, Inc. (Sunnyvale, Calif. 94089), including, for example, FZX F112 freeze material. Alternatively, for example, these materials may include materials commercially available from Rohm and Haas, a wholly owned subsidiary of Dow Chemical Company (Philadelphia, Pa. 19106), including, for example, SC 1000 Surface Curing Agents (SCA).

Figure 2E:
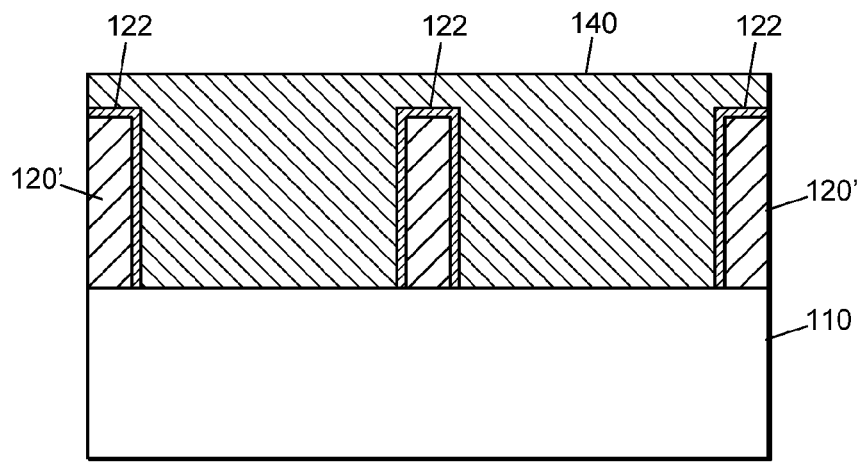

As shown in FIG. 2E, a second layer of radiation-sensitive material 140 is formed on substrate 110. The second layer of radiation-sensitive material 140 may include a photo-resist. For example, the second layer of radiation-sensitive material 140 may comprise a 248 nm (nanometer) resist, a 193 nm resist, a 157 nm resist, an EUV (extreme ultraviolet) resists, or an electron beam sensitive resist. The second layer of radiation-sensitive material 140 may be formed by spin-coating the material onto substrate 110. The second layer of radiation-sensitive material 140 may be formed using a track system. For example, the track system can comprise a Clean Track ACT 8, ACT 12, LITHIUS, LITHIUS Pro, or LITHIUS Pro V resist coating and developing system commercially available from Tokyo Electron Limited (TEL). Other systems and methods for forming a photo-resist film on a substrate are well known to those skilled in the art of spin-on resist technology. The coating process may be followed by one or more second PABs to heat the substrate 110 and one or more cooling cycles, following the one or more second PABs, to cool the substrate 110.

Figure 2F:
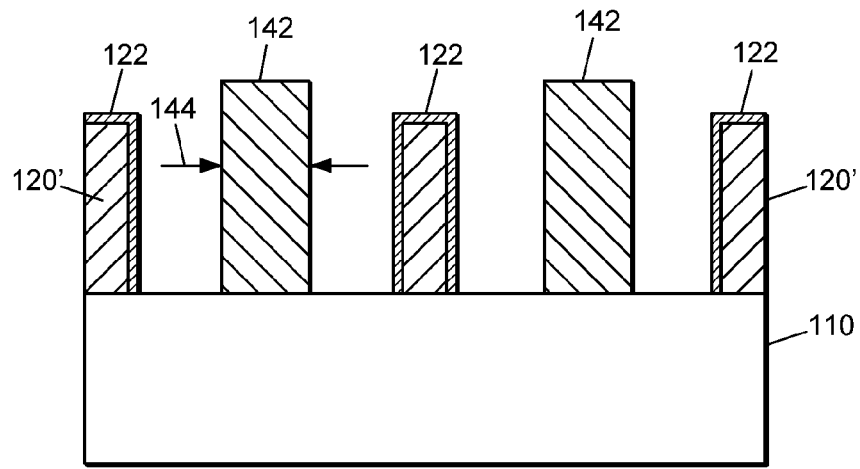

As shown in FIG. 2F, the substrate 110 having the second layer of radiation-sensitive material 140 is aligned at a second alignment position in a radiation exposure system and imaged with second radiation having a second image pattern. The second radiation may be the same as the first radiation or different than the first radiation. The radiation exposure system may include a dry or wet photo-lithography system. The second image pattern may be formed using any suitable conventional stepping lithography system, or scanning lithography system. For example, the photo-lithography system may be commercially available from ASML Netherlands B.V. (Veldhoven, The Netherlands), or Canon USA, Inc., Semiconductor Equipment Division (San Jose, Calif. 95134). Alternatively, the second image pattern may be formed using an electron beam lithography system.

The second layer of radiation-sensitive material 140, having been exposed to the second image pattern, is subjected to a developing process in order to remove the second image pattern region, and form a second pattern 142 in the second layer of radiation-sensitive material 140. The second pattern 142 may be characterized by a second critical dimension (CD) 144. The second pattern 142 may include a second line pattern. The developing process can include exposing the substrate to a developing solution in a developing system, such as a track system. For example, the track system can comprise a Clean Track ACT 8, ACT 12, LITHIUS, LITHIUS Pro, or LITHIUS Pro V resist coating and developing system commercially available from Tokyo Electron Limited (TEL). The developing process may be preceded by one or more second PEBs to heat the substrate 110 and one or more cooling cycles, following the one or more second PEBs, to cool the substrate 110.

Figure 2G:
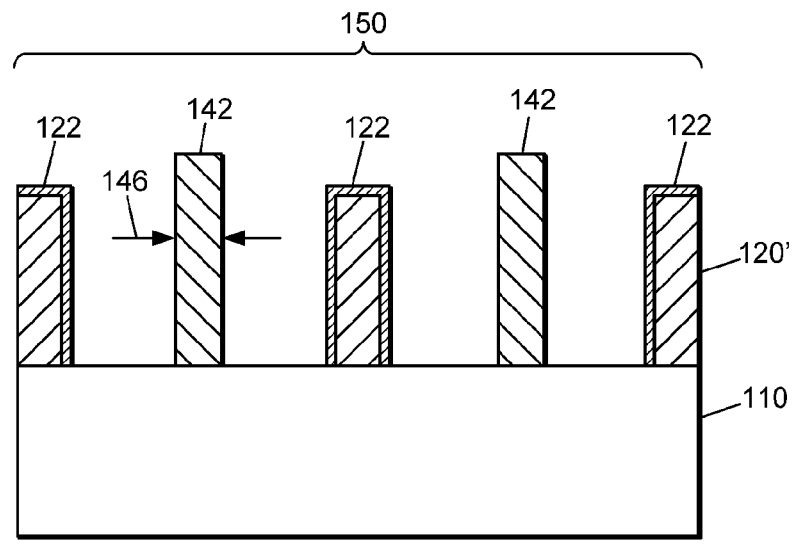

As shown in FIG. 2G, a second critical dimension (CD) slimming process is performed to reduce the second CD 144 to a second reduced CD 146, thus leaving behind a double pattern 150 having the first pattern 122 and the second pattern 142. The double pattern 150, including the first pattern 122 with the first reduced CD 126 and the second pattern 142 with the second reduced CD 146, is transferred to an underlying layer of the substrate 110 using one or more etching processes. The one or more etching processes may include any combination of wet or dry etching processes. The dry etching processes may include dry plasma etching processes or dry non-plasma etching processes.

According to certain embodiments of the present invention, the spacing of the elements 12 of the structure of the second pattern are shifted relative to the target position, which is typically that offset by ½ pitch from the elements 11 of the first pattern.

Figure 3:
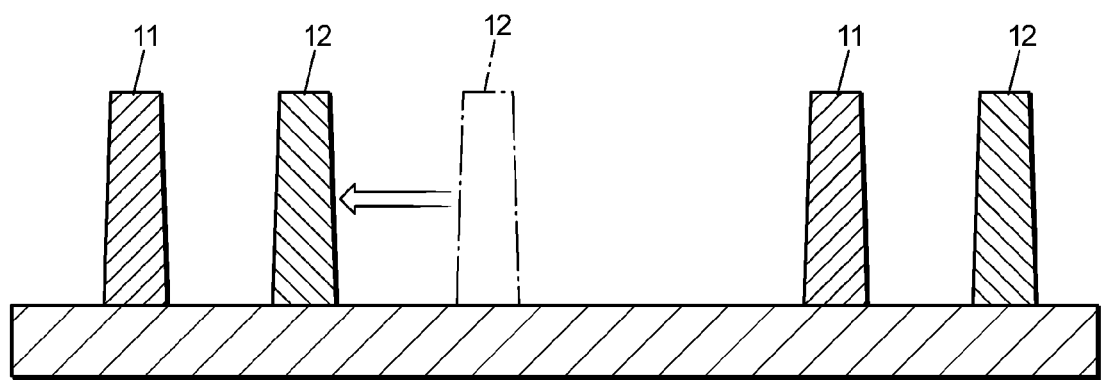
FIG. 3 is a diagram illustrating test structure on a substrate according to certain embodiments of the invention.

One embodiment of the invention is illustrated in FIG. 3, in which the elements 11 and 12 of the respective first and second patterns are both spaced at pitch P and the shifting moves the elements 12 of the second pattern off of the center or ½ pitch position (of FIGS. 1A-1C) toward one and away from another element 11 of the first pattern.

It has been found that this shifting of the patterns in the test structure increases the sensitivity of the measurement of the alignment error between the first and second patterns as the shifting moves from the ½ pitch target position toward the position of the elements of the first pattern, reaches an optimal sensitivity, and then declines to low sensitivity as the elements of the second pattern approach those of the first pattern. This is illustrated in FIG. 3.

Figure 4:
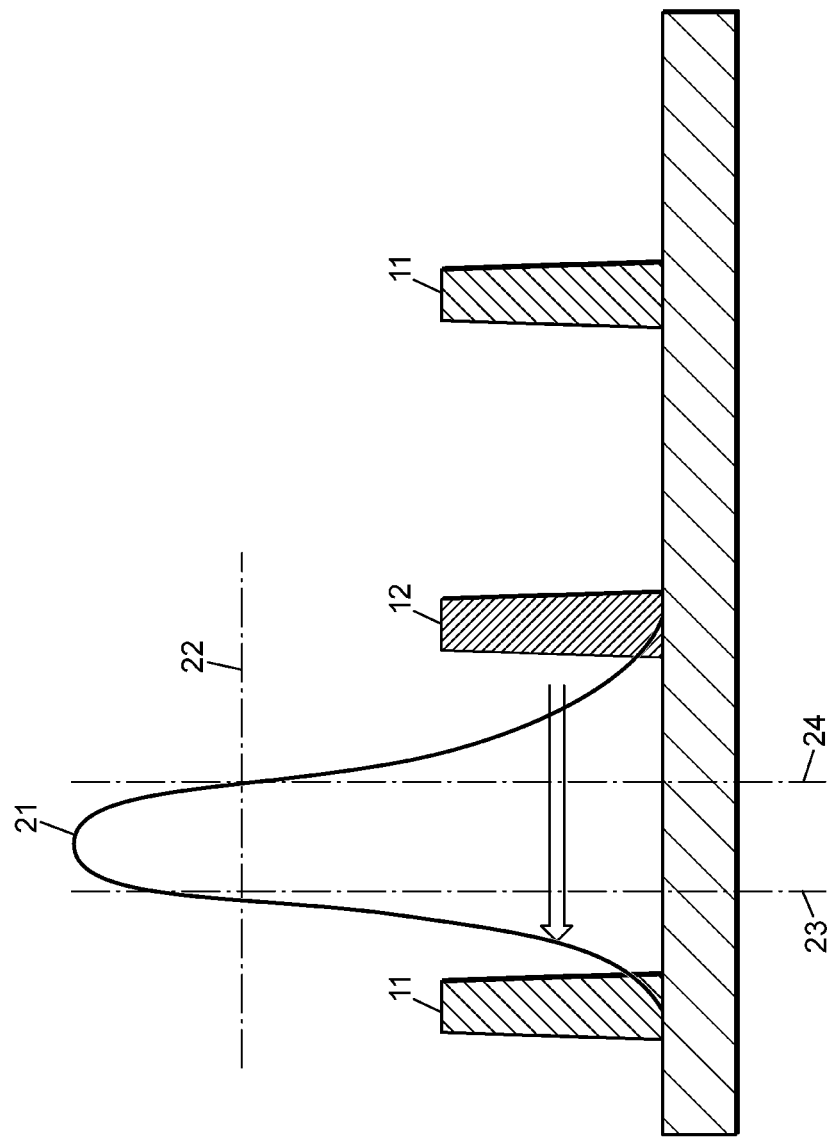
FIG. 4 is a diagram similar to FIG. 3 having plotted thereon a graph representing changes in measurement sensitivity as a function of the spacing between elements of different overlay patterns.

The real structure may be printed such that the second pattern is offset from the first pattern by P/2. However, the test structure may be printed such that the second pattern is offset from the first pattern by about P/4, for example. As you have recognized, measurement sensitivity relates to this offset. As seen in FIG. 3, the elements 11 and 12 of the respective first and second patterns are shown interleaved with the elements 11 and 12 of the respective patterns spaced at pitch P apart, with the elements 12 interleaved and centered between elements 11 at P/2 from the elements 11. At the position P/2, the measurement sensitivity by scatterometry is found to be very low. Moving the element 12 toward element 11 is found to increase the sensitivity of measurements as illustrated by the graph 21, reaching a maximum sensitivity somewhere between P/2 from element 11 and the position element 11, at which the sensitivity again becomes very low. The optimal sensitivity shift may be considered to be about ¼ P for pattern features of presently conventional aspect ratios, but may vary to more or less than P/4 for other feature geometries. Desired sensitivity is shown by the value 22 in FIG. 4, which is achieved when the feature spacing is between the positions 23 and 24 in FIG. 4. These positions 23 and 24 are at some distance that is a function of the geometry of the features and will not be affected by increasing the pitch between elements 11.

The test structure of FIG. 3, may be approximately 40 to 50 microns long and possess a width that is substantially larger than a critical dimension (CD) of the feature pattern, depending on the node size of the patterns. To perform a scatterometry measurement on the structure of FIG. 3, the spot size of the measuring beam should be smaller than the structure so that none of the beam falls outside of the structure. To allow for a beam alignment error of about 2 microns, when performing a scatterometry measurement of the test structure of FIG. 3, a spot size of the illuminating beam may be about 25 to 35 microns in diameter.

While the test structure of FIG. 3 is illustrated as one-dimensional, a two-dimensional structure having an x-y grid with the cross-section shown may be used and will provide a complete structure that will yield measurement of error in two dimensions.

Measurement of overlay error may be carried out by scatterometry as described in U.S. Pat. No. 7,467,064, expressly incorporated by reference herein, particularly paragraphs 29-42 identifying its improvement by reference at the end.

Referring now to FIGS. 5-8, FIG. 5 illustrates a material processing system 201 comprising a treatment system 210 configured to treat a substrate, a process controller 12 for performing at least one of monitoring, measuring, adjusting, or controlling, or a combination of two or more thereof, process data for performing a treatment process in treatment system 10, a metrology system 14 for measuring metrology data from one or more substrates resulting from the treatment process performed in treatment system 10, and a data processor 20. The process controller 12 is capable of executing the method of performing the treatment process in the treatment system 10. Furthermore, the data processor 20 is coupled to the process controller 12 and the metrology system 14. The data processor 20 is capable of interacting with the process controller 12 and the metrology system 14 and exchanging data therewith, and characterizing the inter-relationships between process data from process controller 12 coupled to treatment system 10 and measured metrology data from metrology system 14 using multivariate analysis.

Figure 5:
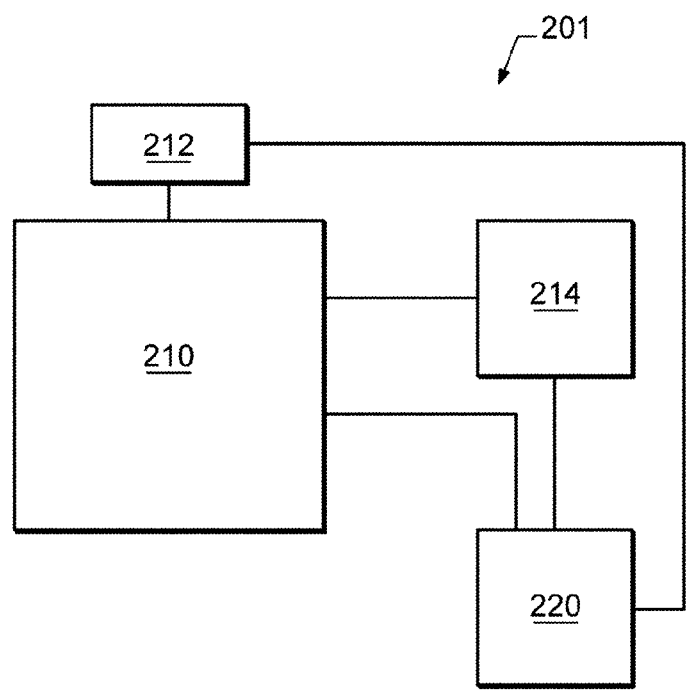
FIG. 5 is a schematic view of a processing system which may be used with overlay error measurement methods according to embodiments of the present invention.
Figure 6:
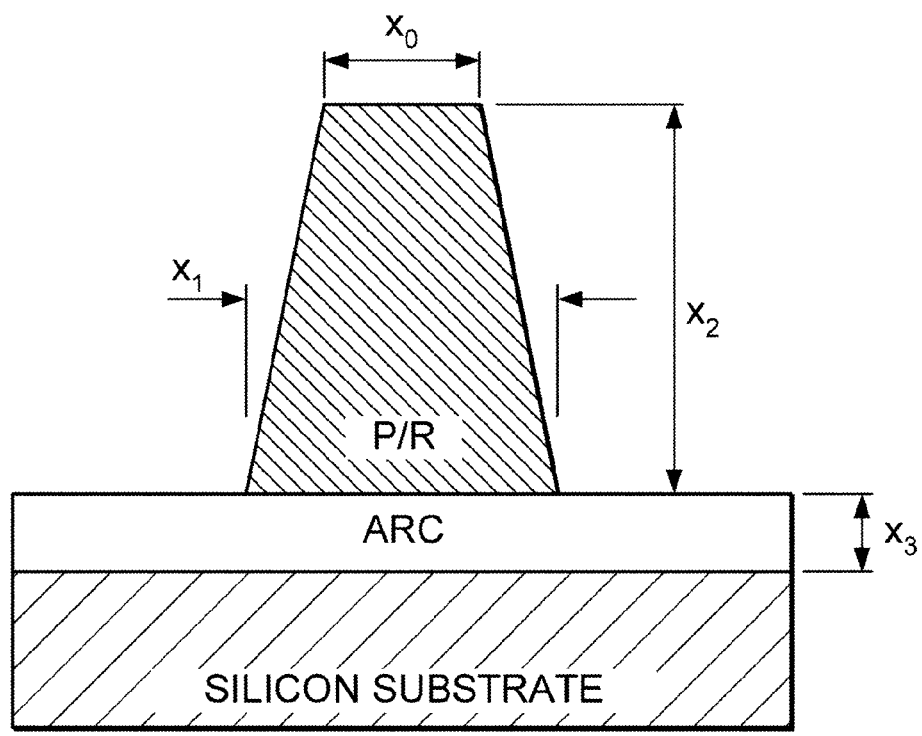
FIG. 6 is a schematic view of a structure to be measured as formed on a substrate.

In the illustrated embodiment, material processing system 1, depicted in FIG. 5, may comprise a lithography system having a track system coupled to a lithographic exposure system, the combination of which is configured to form a film of light-sensitive material, such as photoresist, on a substrate having a pattern, such as an integrated circuit pattern, formed thereon. The patterned film may serve as a patterned mask in a subsequent processing step, such as an etching step. In a process for preparing a lithographic structure, the process data may include, for example, the temperature of the post-application bake (PAB) following the application (or coating) of light-sensitive material to the substrate, the exposure focus during pattern exposure, the exposure dose during pattern exposure, or the temperature of the post-exposure bake (PEB) following pattern exposure. Additionally, the process data may include other parameters such as dispensing rates and spin rates associated with the (light-sensitive material) coating process prior to PAB, or the developing process following PEB.

Alternatively, material processing system 1 may comprise an etching system. The etching system may include a dry etching system or a wet etching system configured to transfer a pattern formed in a mask layer to an underlying layer or layers. For instance, a dry etching system can include a dry plasma etching system configured to facilitate the formation of plasma to assist the creation of chemically reactive constituents and catalyze chemical reactions at the substrate surface. In a process for etching a pattern into an underlying layer, the process data may include, for example, a gas pressure in the treatment system, a flow rate of one or more chemical species (of a process gas) introduced to the treatment system, the power (such as radio frequency (RF) power coupled to the process gas through an electrode in order to facilitate formation of plasma), a time for performing the etching process, or the substrate temperature during processing (which may, in turn, include an electrostatic clamping voltage applied to electrically clamp the substrate to a substrate holder, the temperature of the substrate holder, or a backside pressure of (helium) gas supplied to the backside of the substrate, or any combination thereof, for example).

In another embodiment, material processing system 1 comprises a dielectric coating chamber such as, for example, a spin-on-glass (SOG) or spin-on-dielectric (SOD) system. In another embodiment, material processing system 1 comprises a deposition chamber such as, for example, a chemical vapor deposition (CVD) system, a plasma enhanced CVD (PECVD) system, an atomic layer deposition (ALD) system, a plasma enhanced ALD (PEALD) system, or a physical vapor deposition (PVD) system. In an additional embodiment, material processing system 1 comprises a rapid thermal processing (RTP) chamber such as, for example, a RTP system for thermal annealing. In another embodiment, material processing system 1 comprises a batch diffusion furnace. In yet another embodiment, material processing system 1 can comprise any number of treatment systems found in a semiconductor device manufacturing facility.

Referring still to FIG. 5, metrology system 14 can include an optical metrology system, such as an optical scatterometry system. For instance, the scatterometry system may include an integrated Optical Digital Profilometry (iODP) scatterometry module configured to measure process performance data resulting from the execution of a treatment process in the treatment system 10. The metrology system 14 may, for example, measure or monitor metrology data resulting from the treatment process. The metrology data can, for example, be utilized to determine process performance data that characterizes the treatment process, such as a process rate, a relative process rate, a feature profile angle, a critical dimension, a feature thickness or depth, a feature shape, etc. For example, in a process for preparing a lithographic structure, process performance data can include a critical dimension (CD), such as a top, middle or bottom CD in a feature (i.e., via, line, etc.), a feature depth, a sidewall angle, a sidewall shape, a spatial distribution of any parameter thereof, a parameter to characterize the uniformity of any spatial distribution thereof, etc. Additionally, for example, in a process for etching a pattern into an underlying layer on a substrate, process performance data can include a critical dimension (CD), such as a top, middle or bottom CD in a feature (i.e., via, line, etc.), a feature depth, a sidewall angle, a sidewall shape, an etch rate, a relative etch rate (e.g., etch selectivity), etc.

The metrology system can be either an in-situ or ex-situ device. For example, the metrology system may include a scatterometer, incorporating beam profile ellipsometry (ellipsometer) and beam profile reflectometry (reflectometer), commercially available from Therma-Wave, Inc. (Fremont, Calif. 94539) or Nanometrics, Inc. (Milpitas, Calif. 95035), which is positioned within the transfer chamber (not shown) to analyze substrates transferred into and out of treatment system 10.

When performing optical metrology, such as scatterometry, a structure on a substrate, such as a semiconductor wafer or flat panel, is illuminated with electromagnetic (EM) radiation, and a diffracted signal received from the structure is utilized to reconstruct the profile of the structure. The structure may include a periodic structure, or a non-periodic structure. Additionally, the structure may include an operating structure on the substrate (i.e., a via or contact hole, or an interconnect line or trench, or a feature formed in a mask layer associated therewith), or the structure may include a periodic grating or non-periodic grating formed proximate to an operating structure formed on a substrate. For example, the periodic grating can be formed adjacent a transistor formed on the substrate. Alternatively, the periodic grating can be formed in an area of the transistor that does not interfere with the operation of the transistor. The profile of the periodic grating is obtained to determine whether the periodic grating, and by extension the operating structure adjacent the periodic grating, has been fabricated according to specifications. For instance, FIG. 2 illustrates an exemplary structure on a substrate, such as a silicon substrate, having a top critical dimension (CD) $x_0$, a bottom CD $x_1$, and a height $x_2$. Additionally, the structure may reside atop another layer having a thickness $x_3$, such as an anti-reflective coating (ARC) layer. For example, the structure illustrated in FIG. 6 may represent a lithographic structure.

Figure 7:
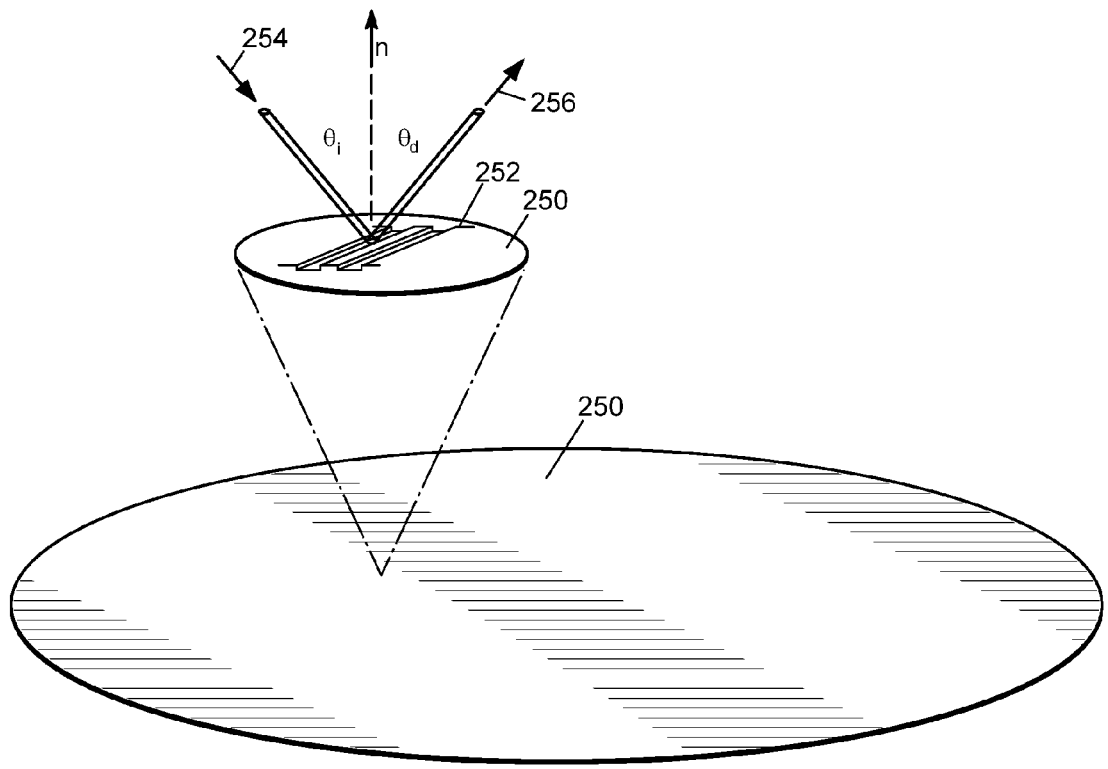
FIG. 7 is a schematic view depicting a technique for illuminating a structure on a substrate with electromagnetic radiation for measurement.

Referring now to FIG. 7, a periodic grating (or structure) 52 on a substrate 50 is illuminated by an incident signal 54 from an EM source, such as an ellipsometer or reflectometer. The incident signal 54 is directed onto the periodic grating 52 at an angle of incidence ($\theta_i$) with respect to the surface normal vector (n) of the periodic grating 52. A diffraction signal 56 leaves the periodic grating 52 at an angle of diffraction ($\theta_d$) with respect to the surface normal vector. In one exemplary embodiment, the angle of incidence is near the Brewster's angle. However, the angle of incidence can vary depending upon the application. For instance, the angle of incidence can range from approximately 0 degrees to approximately 80 degrees. Additionally, for instance, the angle of incidence can range from approximately 40 degrees to approximately 75 degrees, and desirably, it may range from approximately 50 degrees to approximately 70 degrees.

Figure 8:
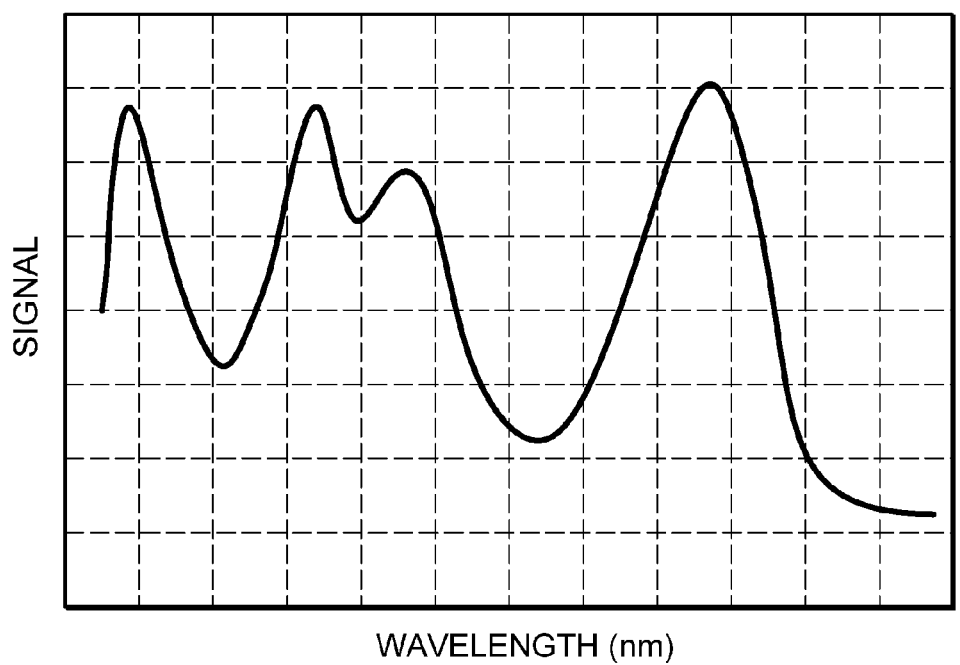
FIG. 8 illustrates an exemplary measured signal obtained from illuminating a structure on a substrate with electromagnetic radiation by scatterometry.

The diffraction signal is received by a detector and analyzed by a signal processing system. When the EM source is an ellipsometer, the magnitude and the phase of the diffraction signal are received and detected. When the EM source is a reflectometer, the relative intensity of the diffraction signal is received and detected. For instance, FIG. 8 illustrates an exemplary optical spectrum obtained using a scatterometric technique.

The signal processing system compares the diffraction signal received by the detector to simulated diffraction signals stored in a library of simulated signals. Each simulated diffraction signal in the library is associated with a hypothetic profile. When a best match is made between the diffraction signal received from the detector and one of the simulated diffraction signals in the library, the profile associated with best matched simulated diffraction signal is presumed to represent the actual profile of the periodic grating or structure. The best matched simulated diffraction signal and/or the associated profile can then be provided to assist in determining whether the periodic grating or structure has been fabricated according to specifications. In another embodiment, the signal processing system compares the diffraction signal received by the detector to a series of simulated diffraction signals determined in real time. The simulated diffraction signals are determined from an assumed set of profile parameters wherein the next set of profile parameters are altered according to one or more optimization algorithms. For details of the method for generating simulated diffraction signals for real time use or to be used in a library, refer to U.S. Pat. No. 6,943,900 "GENERATION OF A LIBERTY OF PERIODIC GRATING DIFFRACTION SIGNALS", by Niu, et al., with an effective date Jul. 16, 2001, which is incorporated herein in its entirety.

As described above, the library includes simulated diffraction signals that are associated with hypothetical profiles of the periodic grating or structure formed on the substrate of interest. Typically, the process for preparing the library can include: (1) characterizing the film stack of the periodic grating or structure; (2) obtaining the optical properties of the materials used in forming the periodic grating or structure; (3) obtaining measured diffraction signals from the periodic grating or structure; (4) determining the number of hypothetical parameters (e.g., geometrical parameters, which may be related to process performance parameters such as CD) to use in modeling the profile of the periodic grating or structure; (5) adjusting the range to vary the hypothetical parameters in generating a set of hypothetical profiles; (6) determining the number of layers to use in dividing up a hypothetical profile to generate a simulated diffraction signal for the hypothetical profile; (7) determining the number of harmonic orders to use in generating the set of simulated diffraction signals; (8) determining a resolution to use in generating the set of simulated diffraction signals; (9) and generating the set of simulated diffraction signals based on the adjusted range, parameterization, and/or resolution.

For example, the library can include a range of diffraction signals sufficiently broad to capture the corresponding substrate-to-substrate variations, and batch-to-batch variations, or drift in the set of hypothetical parameters associated with a pre-determined process of record (or nominal process recipe) for performing the specific substrate treatment process. Additionally, for example, the library can include a range of diffraction signals sufficiently broad to capture the corresponding variations in the set of hypothetical parameters associated with a pre-determined process window for performing the specific substrate treatment process.

However, since the relationship between process data, metrology data, such as diffraction signals, and process performance data (or hypothetical parameters characterizing a structure or periodic grating) are not known a priori, the generation of the library and the determination of a sufficient resolution in generating the library is often very labor-intensive and time consuming, even when there exists some experience regarding these inter-relationships. Moreover, a separate library is required for each application.

The use of multivariate analysis, when applied to the set of process data, metrology data (diffraction signals) and process performance data can assist in identifying these inter-relationships. For example, the multivariate analysis can include a linear analysis, or a nonlinear analysis. Additionally, for example, the multivariate analysis can include Principal Components Analysis (PCA), Independent Component Analysis, Cross Correlation Analysis, Linear Approximation Analysis, and the like.

The challenges in measuring errors in the alignment of the elements 11 and the elements 12 of the respective first and second patterns of the structure shown in FIGS. 1A-1C are that the sensitivity of scatterometric measurements to small errors in the alignment is very low, and that the shrinking geometry makes it difficult to separate the first and second patterns.

Figure 9:
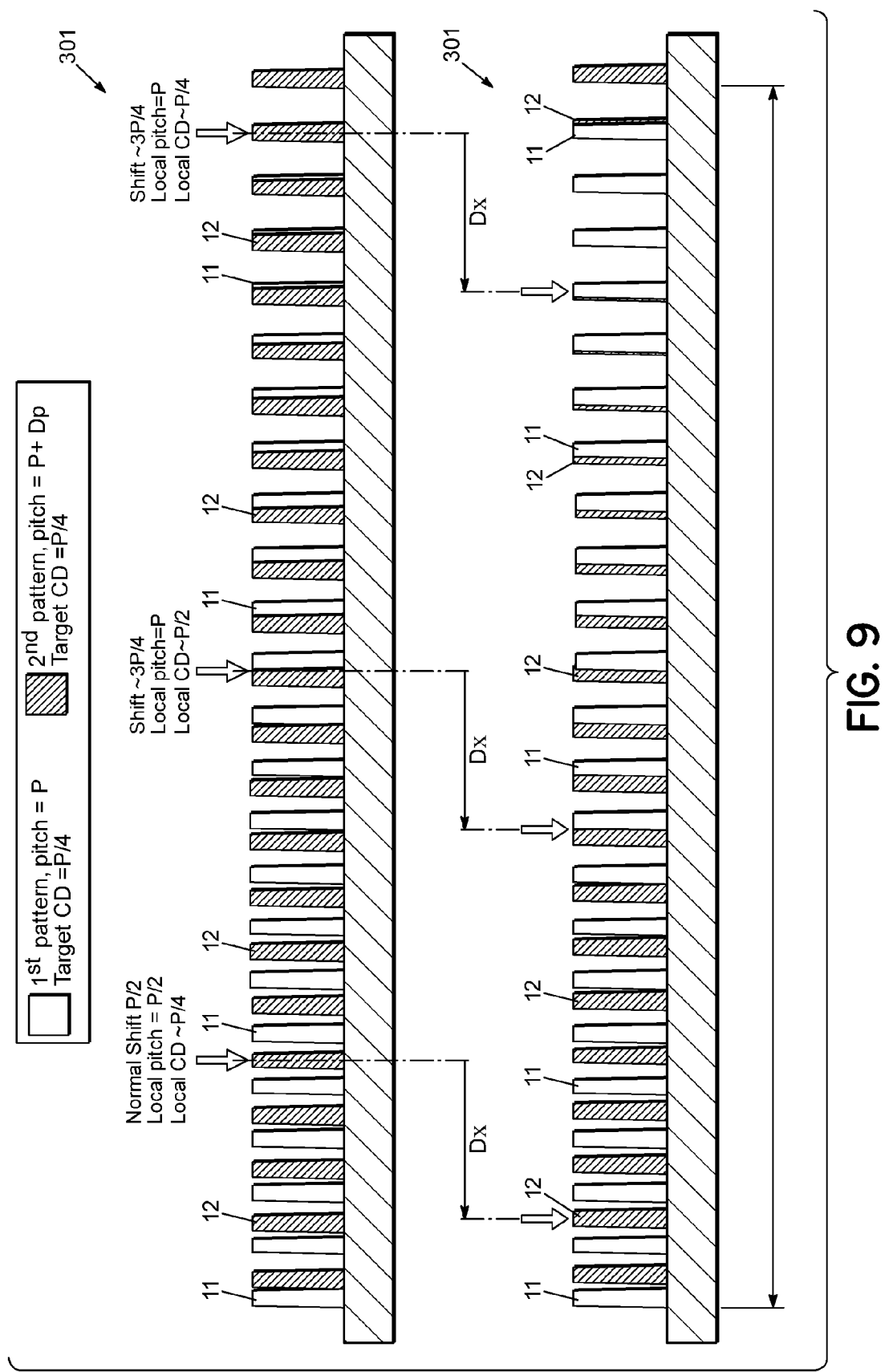
FIG. 9 are diagrams, similar to FIG. 3, illustrating test structure on a substrate according to certain other embodiments of the invention.

Another embodiment of the invention is illustrated in FIG. 9, in which test structure 301 includes a first pattern having elements 11 is formed at pitch P, which might be, for example 45 nm, and a second pattern having elements 12 is formed at a pitch P+DP, where DP is one or more orders of magnitude less than P, and preferably two or more orders of magnitude less than P. Approximately 1/500 or less of P is believed to be the most practical. As with the structure of FIG. 3, this structure may be formed in two dimensions at the same time. When overlaid, elements of the first and second patterns will coincide and form a single element having a CD of, for example, P/4 at one position, represented by position A in FIG. 9, and would be again at position spaced a distance $P^2/DP$, which would be about 45 microns from position A. At half this distance, or 22.5 microns from A, at point B in FIG. 9, the elements would be out of phase and with an element 12 of the second pattern spaced midway between elements 11 of the first pattern, or at P/2 from an element 11 of the first pattern. At point C, halfway between points A and B, at 11.25 microns from A, the elements 11 and 12 will form a single element having a CD of P/2.

The structure 301 can be about 50 microns square, or 50×5 micro rectangular shapes, more or less, and measured by illumination with a fixed radiation beam larger than, and aimed at the center of, the structure 301. The reflected radiation from the structure will vary as a function of the position on the structure, since the reflectivity is a function of fill ratio of the structure.

The structure 301 in FIG. 9 represents the same structure 301 where the second pattern is overlaid with a position error E. When this occurs, the positions A, B, and C will be displaced a distance DX, which will equal E multiplied by P/DP. This will result in a difference in the reflected function that has an increased sensitivity of P/DP to the error E, which can be determined by comparing simple reflectivity function measurements, without the need to use the complex scatterometry techniques.

The invention may be used in evaluating product wafers or in identifying error during production, between wafers, to make process adjustments to reduce or eliminate the errors. The overlay measurements in X and Y directions can be deconvoluted into exposure tool operating parameters according to any of many known models. These parameters include grid-level and shot-level, such as X-shift, Y-shift, wafer rotation, scaling, etc. An APC controller utilizes these error calculations and decides the strategy to adjust those manipulated parameters, these reduce or eliminate the errors for subsequent wafers.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope of the general inventive concept.

What is claimed is:

1. A method of patterning a substrate comprising:
forming first and second patterns on the substrate by a double patterning process, wherein the first pattern comprises elements at a given pitch and the second pattern comprises elements overlaid on the first pattern respectively positioned at a mid-position spaced midway between adjacent elements of the first pattern;
forming a test structure on the surface of the substrate having a plurality of the elements of at least the second pattern spaced from the respective mid-positions and spaced from the elements of the first pattern; and
measuring light reflected from the test structure so formed thereby enhancing sensitivity of the measuring of overlay alignment error of the first and second patterns formed on the substrate.

2. The method of claim 1 wherein:
the forming of the test structure includes forming the test structure having elements of the first and second patterns formed thereon and having the plurality of elements of the second pattern spaced midway between the respective mid-positions and the elements of the first pattern.

3. The method of claim 2 wherein:
the measuring includes measuring by scatterometry light diffracted from the test structure and comparing the results of the measuring with a library of measurement results corresponding to a plurality of different overlay error conditions to determine the overlay error.

4. The method of claim 1 wherein the forming of the first and second patterns on the substrate includes forming the first and second patterns having the elements of the first and second patterns formed in each of two dimensions on the substrate by the double patterning process and the forming the test structure includes forming the test structure having the elements of at least the second pattern formed thereon in each of the two dimensions on the substrate.

5. The method of claim 1 wherein:
the first and the second patterns are of the same given pitch; and
the forming of the test structure includes forming the test structure having elements of the first pattern spaced at the given pitch and the plurality of elements of the second pattern spaced at a second pitch that differs from the given pitch by at least an order of magnitude less than the given pitch.

6. The method of claim 5 wherein:
the forming of the test structure includes forming the test structure having the plurality of elements of the second pattern spaced at a second pitch that differs from the given pitch by at least two or more orders of magnitude less than the given pitch.

7. The method of claim 6 wherein:
the forming of the test structure includes forming the test structure having the plurality of elements of the second pattern spaced at a second pitch that differs from the given pitch by three orders of magnitude less than the given pitch.

8. The method of claim 7 wherein:
the measuring includes measuring reflectivity as a function of position on the test structure and comparing the results of the measuring with a library of measurement results corresponding to a plurality of different overlay error conditions to determine the overlay error.

9. The method of claim 5 wherein:
the measuring includes measuring reflectivity as a function of position on the test structure.

10. The method of claim 5 wherein:
the measuring includes measuring a relative intensity, polarization, or a combination of both, of reflected light as a function of position on the test structure.

11. The method of claim 5 wherein the forming of the first and second patterns on the substrate includes forming the first and second patterns having the elements of the first and second patterns formed in each of two dimensions on the substrate by the double patterning process and the forming the test structure includes forming the test structure having the elements of at least the second pattern formed thereon in each of the two dimensions on the substrate.

12. The method of claim 1 wherein the forming of the first and second patterns on the substrate includes forming the first and second patterns having the elements of the first and second patterns formed in each of two dimensions on the substrate by the double patterning process and the forming the test structure includes forming the test structure having the elements of at least the second pattern formed thereon in each of the two dimensions on the substrate.

13. The method of claim 1 wherein the forming of the first and second patterns includes performing a Litho-Etch-Litho-Etch process, a Litho-Litho-Etch process or a Litho-Freeze-Litho-Etch process.

14. The method of claim 13 wherein:
the first and second patterns are of the same given pitch, and wherein the forming of the test structure includes forming the test structure having elements of the first and second patterns formed thereon and having the plurality of elements of the second pattern spaced midway between the respective mid-positions and the elements of the first pattern; and
the measuring includes measuring by scatterometry light diffracted from the test structure and comparing results of the measuring with a library of measurement results corresponding to a plurality of different overlay error conditions to determine the overlay error.

15. A method of manufacturing patterned semiconductor wafers comprising patterning a semiconductor wafer according to the method of claim 14 and feeding back results of the measuring to a process controller and controlling the manufacture of subsequent patterned wafers in response to the determined overlay error.

16. The method of claim 13 wherein:
the first and second patterns are of the same given pitch, and wherein the forming of the test structure includes forming the test structure having elements of the first pattern spaced at the given pitch and having the plurality of elements of the second pattern spaced at a second pitch that differs from the given pitch by at least an order of magnitude less than the given pitch; and
the measuring includes measuring reflectivity as a function of position on the test structure and comparing results of the measuring with a library of measurement results corresponding to a plurality of different overlay error conditions to determine the overlay error.

17. A method of manufacturing patterned semiconductor wafers comprising patterning a semiconductor wafer according to the method of claim 16 and feeding back results of the measuring to a process controller and controlling the manufacture of subsequent patterned wafers in response to the determined overlay error.

18. A method of manufacturing patterned semiconductor wafers comprising patterning a semiconductor wafer according to the method of claim 1 and feeding back results of the measuring to a process controller and controlling the manufacture of subsequent patterned wafers in response to the measured overlay alignment error.

* * * * *

UNITED STATES PATENT AND TRADEMARK OFFICE
CERTIFICATE OF CORRECTION

PATENT NO. : 8,980,651 B2
APPLICATION NO. : 13/250615
DATED : March 17, 2015
INVENTOR(S) : Hongyu Henry Yue et al.

It is certified that error appears in the above-identified patent and that said Letters Patent is hereby corrected as shown below:

On the Title page, item (54) and in the Specification, Col. 1, line 1, In the Title, "OVERLAY MEASUREMENT FOR A DOUBLE PATTERNING" should read --OVERLAY MEASUREMENT FOR DOUBLE PATTERNING--.

In the Specification,

In Col. 2, line 63, "The image base method" should read --The image-based method--.

In Col. 2, line 64, "that include optics" should read --that includes optics--.

In Col. 3, line 33, "signal is typically" should read --signal are typically--.

In Col. 5, line 36, "FIG. 9 are diagrams," should read --FIG. 9 shows diagrams,--.

In Col. 9, line 30, "EUV (extreme ultraviolet) resists," should read --EUV (extreme ultraviolet) resist,--.

In Col. 10, line 67, "FIG. 3, may be" should read --FIG. 3 may be--.

In Col. 13, line 67, "LIBERTY" should read --LIBRARY--.

In Col. 14, line 64, "elements 11 is formed" should read --elements 11 formed--.

Signed and Sealed this
Twenty-ninth Day of March, 2016

Michelle K. Lee
*Director of the United States Patent and Trademark Office*